United States Patent
Liu et al.

(10) Patent No.: US 9,082,897 B2
(45) Date of Patent: Jul. 14, 2015

(54) SOLAR POWER STORAGE MODULE, AND SOLAR POWER STORAGE SYSTEM AND SOLAR POWER SUPPLY SYSTEM HAVING SAME

(75) Inventors: Zhi-Xiang Liu, Beijing (CN); Cheng Wang, Beijing (CN); Zong-Qiang Mao, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 1099 days.

(21) Appl. No.: 13/105,126

(22) Filed: May 11, 2011

(65) Prior Publication Data

US 2012/0169269 A1 Jul. 5, 2012

(30) Foreign Application Priority Data

Dec. 29, 2010 (CN) .......................... 2010 1 0612466

(51) Int. Cl.
| | |
|---|---|
| *H01M 10/44* | (2006.01) |
| *H01L 31/02* | (2006.01) |
| *H01M 10/46* | (2006.01) |
| *H02J 3/38* | (2006.01) |
| *H02J 7/35* | (2006.01) |
| *H02S 40/38* | (2014.01) |

(52) U.S. Cl.
CPC ....... *H01L 31/02021* (2013.01); *H01M 10/465* (2013.01); *H02J 3/383* (2013.01); *H02J 7/35* (2013.01); *H02S 40/38* (2014.12); *Y02E 10/563* (2013.01); *Y02E 10/566* (2013.01)

(58) Field of Classification Search
CPC .................................. H02J 3/383; H02J 3/385
USPC .......................................................... 320/101
See application file for complete search history.

(56) References Cited

U.S. PATENT DOCUMENTS

| | | | |
|---|---|---|---|
| 6,034,506 A | | 3/2000 | Hall |
| 7,570,010 B2 | | 8/2009 | Benckenstein, Jr. et al. |
| 7,839,019 B2 | | 11/2010 | Chang et al. |
| 8,324,857 B1 * | | 12/2012 | Chang et al. .................. 320/101 |
| 2009/0266397 A1 * | | 10/2009 | Gibson et al. ................. 136/244 |
| 2009/0302681 A1 * | | 12/2009 | Yamada et al. ................. 307/46 |
| 2010/0001681 A1 * | | 1/2010 | Zhang et al. .................. 320/101 |
| 2010/0148726 A1 | | 6/2010 | Lee et al. |

FOREIGN PATENT DOCUMENTS

| | | |
|---|---|---|
| CN | 2909664 Y | 6/2007 |
| CN | 201393059 Y | 1/2010 |

* cited by examiner

*Primary Examiner* — Edward Tso
*Assistant Examiner* — Johali Torres Ruiz
(74) *Attorney, Agent, or Firm* — Novak Druce Connolly Bove + Quigg LLP

(57) ABSTRACT

A solar power supply system includes a power supply bus and a plurality of solar power storage systems. The power storage systems is electrically connected to each other in parallel via the power supply bus. Each of the solar power storage systems includes solar power storage modules and an inverter electrically connected to an external load and the solar power storage modules in series. Each of the solar power storage modules includes a lithium-ion battery unit, a solar cell unit, and a battery control unit. The solar cell unit charges the lithium-ion battery unit. The battery control unit is electrically connected to the lithium-ion battery unit and the solar cell unit, and controls the lithium-ion battery unit being charged or discharged.

14 Claims, 6 Drawing Sheets

US 9,082,897 B2

SOLAR POWER STORAGE MODULE, AND SOLAR POWER STORAGE SYSTEM AND SOLAR POWER SUPPLY SYSTEM HAVING SAME

BACKGROUND

1. Technical Field

The present disclosure relates to a solar power storage module with a battery control unit for controlling a lithium-ion battery unit being charged or discharged, and a solar power storage system and a solar power supply system having the same.

2. Description of Related Art

A conventional solar power supply system having a solar cell unit that converts solar light energy into electricity can be used as a power source for electronic devices. However, the conventional power solar power supply system presents a problem in that power generated by the solar cell unit is not stable due to changes in the surrounding environments such as variations in intensity of sunlight (solar irradiation) and ambient temperatures. To solve the problems, a lithium-ion battery unit electrically connected to and charged by the solar cell unit is used to store the electricity generated by the solar unit.

In the lithium-ion battery unit, lithium-ion batteries are connected to each other in series. The variations of capacitance, initial voltage, and temperature from one lithium-ion battery to another would affect the properties for the different lithium-ion batteries. An overcharge or an overdischarge can result in a rupture or a fire. An overcharge or an overdischarge would pose a problem of an extremely shortened service life of the lithium-ion batteries of the lithium-ion battery unit.

What is needed, therefore, is to provide a solar power supply system having lithium-ion batteries, which can have a long service life and high safety performance.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
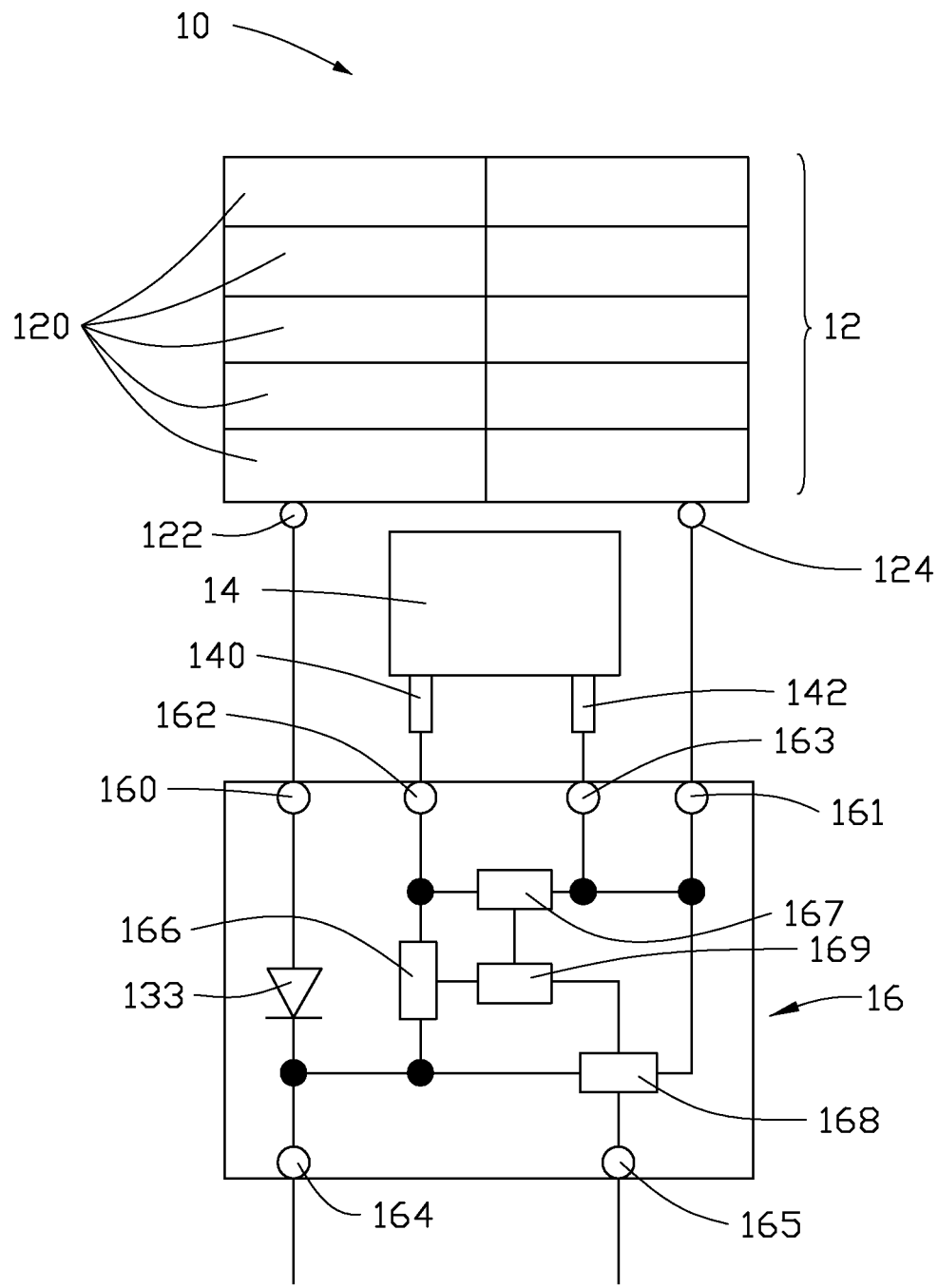
FIG. 1 is a schematic view of one embodiment of a solar power storage module.

According to one embodiment, a solar power storage module 10 as illustrated in FIG. 1 includes a solar cell unit 12, a lithium-ion battery unit 14, and a battery control unit 16. The battery control unit 16 is electrically connected to the solar cell unit 12 and the lithium-ion battery unit 14.

The solar cell unit 12 includes a solar cell positive output 122, a solar cell negative output 124, and a number of solar cells 120 which can be connected to each other in series or in parallel. An output voltage of the solar cell unit 12 can be improved when the solar cells 120 are connected to each other in series. An output current of the solar cell unit 12 can be improved when the solar cells 120 are connected to each other in parallel. The solar cell positive output 122 and the solar cell negative output 124 are electrically connected to the series-connected or the parallel-connected solar cells 120.

The solar cells 120 could be monocrystalline silicon solar cells, polycrystalline silicon solar cells, amorphous silicon solar cells, multinary compound thin film solar cells, polymer multilayer modified electrode solar cells, nanocrystalline solar cells, organic solar cells, or any combination thereof. An open voltage of the solar cell unit 12 is about one time to about four times greater than a cut-off charge voltage of the lithium-ion battery unit 14 such that the solar cell unit 12 charges the lithium-ion battery unit 14. The open voltage of the solar cell unit 12 is an output voltage of the same when a light source of about 100 milliwatts per square centimeter ($mW/cm^2$) illuminates the solar cell unit 12. In one embodiment, the open voltage of the solar cell unit 12 is about one time to about two times greater than the cut-off charge voltage of the lithium-ion battery unit 14.

A short current of the solar cell unit 12 is equal to or smaller than a maximal charge current of the lithium-ion battery unit 14 to avoid shortening a service life of the lithium-ion battery unit 14 due to an overcharge of current. The short circuit current of the solar cell unit 12 is generated by shorting the solar cell positive output 122 and the solar cell negative output 124 when a light source of about 100 ($mW/cm^2$) illuminates the solar cell unit 12.

The lithium-ion battery unit 14 includes a lithium-ion battery positive output 140, a lithium-ion battery negative output 142, and a number of lithium-ion batteries (not shown). The lithium-ion batteries, which are disposed in the lithium-ion battery unit 14, are connected to each other in parallel to balance the voltage of each of lithium-ion batteries. Thus, the lithium-ion batteries would not overcharge or discharge. Each of the lithium-ion batteries includes an anode and a cathode. The lithium-ion battery positive output 140 is electrically connected to the anodes of the lithium-ion batteries. The lithium-ion battery positive output 140 is electrically connected to the cathodes of the lithium-ion batteries.

The lithium-ion batteries could be lithium iron phosphate batteries, lithium cobaltate batteries, lithium manganate batteries, lithium cobalt manganate batteries, or any combination thereof. More specifically, an operation voltage of the lithium iron phosphate battery is in a range from about 2.5 V to about 3.6 V. An operation voltage of the lithium manganate battery is in a range from about 3 V to about 4 V. Thus, the lithium-ion battery unit 14 has a cut-off charge voltage when it is charged. On the contrary, the lithium-ion battery unit 14 has a cut-off discharge voltage when it is discharged.

The battery control unit 16 controls the lithium-ion battery unit 14 charged by the solar cell unit 12, and controls the solar cell unit 12 and the lithium-ion battery unit 14 supplying power to an external load (not shown). The battery control unit 16 includes a diode 133, a solar cell positive input 160, a solar cell negative input 161, a lithium-ion battery positive input 162, a lithium-ion battery negative input 163, a first output 164, a second output 165, an overcharge protection circuit 166, a discharge protection circuit 168, a sensing circuit 167, and a control circuit 169.

The battery control unit 16 is electrically connected to the solar cell unit 12 and the lithium-ion battery unit 14. More specifically, the solar cell positive input 160 is electrically connected to the solar cell positive output 122 of the solar cell unit 12. The solar cell negative input 161 is electrically connected to the solar cell negative output 124 of the solar cell unit 12. The lithium-ion battery positive input 162 is electrically connected to the lithium-ion battery positive output 140 of the lithium-ion battery unit 14. The lithium-ion battery negative input 163 is electrically connected to the lithium-ion battery negative output 142 of the lithium-ion battery unit 14. The first output 164 and the second output 165 are electrically connected to the external load such that the solar power storage module 10 can supply power to the external load.

The overcharge protection circuit 166 controls the lithium-ion battery unit 14 being charged by the solar cell unit 12 to avoid overcharging the lithium-ion battery unit 14. The discharge protection circuit 168 controls the lithium-ion battery unit 14 supplying power to the external load to avoid over discharging the lithium-ion battery unit 14. The sensing circuit 167 detects an operation voltage of the lithium-ion battery unit 14, and feedbacks the operation voltage of the lithium-ion battery unit 14 to the control circuit 169. The control circuit 169, which initially stores the cut-off charge voltage and the cut-off discharge voltage, receives the operation voltage of the lithium-ion battery unit 14. The control circuit 169 compares the operation voltage of the lithium-ion battery unit 14 with the cut-off charge voltage and the cut-off discharge voltage to generate a comparing signal. The overcharge protection circuit 166 controls the lithium-ion battery unit 14 being charged by the comparing signal. The discharge protection circuit 168 controls the lithium-ion battery unit 14 being discharged by the comparing signal.

In one embodiment, the overcharge protection circuit 166 is electrically connected to the solar cell positive input 160, the lithium-ion battery positive input 162, the control circuit 169, and the first output 164. The discharge protection circuit 168 is electrically connected to the solar cell positive input 160, the solar cell negative input 161, the lithium-ion battery negative input 163, the overcharge protection circuit 166, the control circuit 169, the first output 164, and the second output 165. The lithium-ion battery negative input 163 is electrically connected to the solar cell negative input 161. The solar cell positive input 160 is electrically connected to the first output 164 via the diode 133. The sensing circuit 167 is electrically connected to the lithium-ion battery positive input 162 and the lithium-ion battery negative input 163. The control circuit 169 is electrically connected to the overcharge protection circuit 166, the sensing circuit 167, and the discharge protection circuit 168.

When the operation voltage of the lithium-ion battery unit 14 is equal to or smaller than the cut-off discharge voltage, the overcharge protection circuit 166 electrically connects to the solar cell unit 12 and the lithium-ion battery unit 14 in parallel according to the comparing signal generated by the control circuit 169. More specifically, the solar cell positive input 160 electrically connects to the lithium-ion battery positive input 162 via the overcharge protection circuit 166. The solar cell negative input 161 electrically connects to the lithium-ion battery negative input 163. Thus, the solar cell unit 12 charges the lithium-ion battery unit 14.

At the same time, the control circuit 169 controls the overcharge protection circuit 166 to electrically connect to the lithium-ion battery positive input 162 and the first output 164. Furthermore, when the operation voltage of the lithium-ion battery unit 14 is greater than the cut-off discharge voltage, the control circuit 169 controls the discharge protection circuit 168 to electrically connect to the lithium-ion battery negative input 163 and the second output 165, and to the solar cell negative input 161 and the second output 165. Thus, the solar cell unit 12 and the lithium-ion battery unit 14 supply power to the external load when the solar cell unit 12 charges the lithium-ion battery unit 14.

When the operation voltage of the lithium-ion battery unit 14 is equal to or greater than the cut-off charge voltage, the overcharge protection circuit 166 breaks the electrical connection between the lithium-ion battery unit 14 and the solar cell unit 12 according to the comparing signal generated by the control circuit 169. The lithium-ion battery unit 14 simultaneously supplies power to the external load until the operation voltage of the lithium-ion battery unit 14 is equal to or smaller than the cut-off discharge voltage. The overcharge protection circuit 166 then electrically connects to the solar cell unit 12 and the lithium-ion battery unit 14. Thus, the solar cell unit 12 charges the lithium-ion battery unit 14 once more.

More specifically, when the operation voltage of the lithium-ion battery unit 14 is equal to or smaller that the cut-off discharge voltage, the control circuit 169 controls the discharge protection circuit 168 shorting the first output 164 and the second output 165 of the battery control unit 16. Thus, the solar cell unit 12 and the lithium-ion battery unit 14 cease supplying power to the external load.

In one embodiment, a time of the control circuit 169 controlling the discharge protection circuit 168 shorting the first output 164 and the second output 165 of the battery control unit 16 is smaller than about 20 milliseconds. An anode of the diode 133 is electrically connected to the solar cell positive input 160. A cathode of the diode 133 is electrically connected to the first output 164 and the overcharge protection circuit 166. Thus, the solar cell unit 12 is unable to be charged by the lithium-ion battery unit 14 when an operation voltage of the solar cell unit 12 is smaller than the operation voltage of the lithium-ion battery unit 14.

Figure 2:
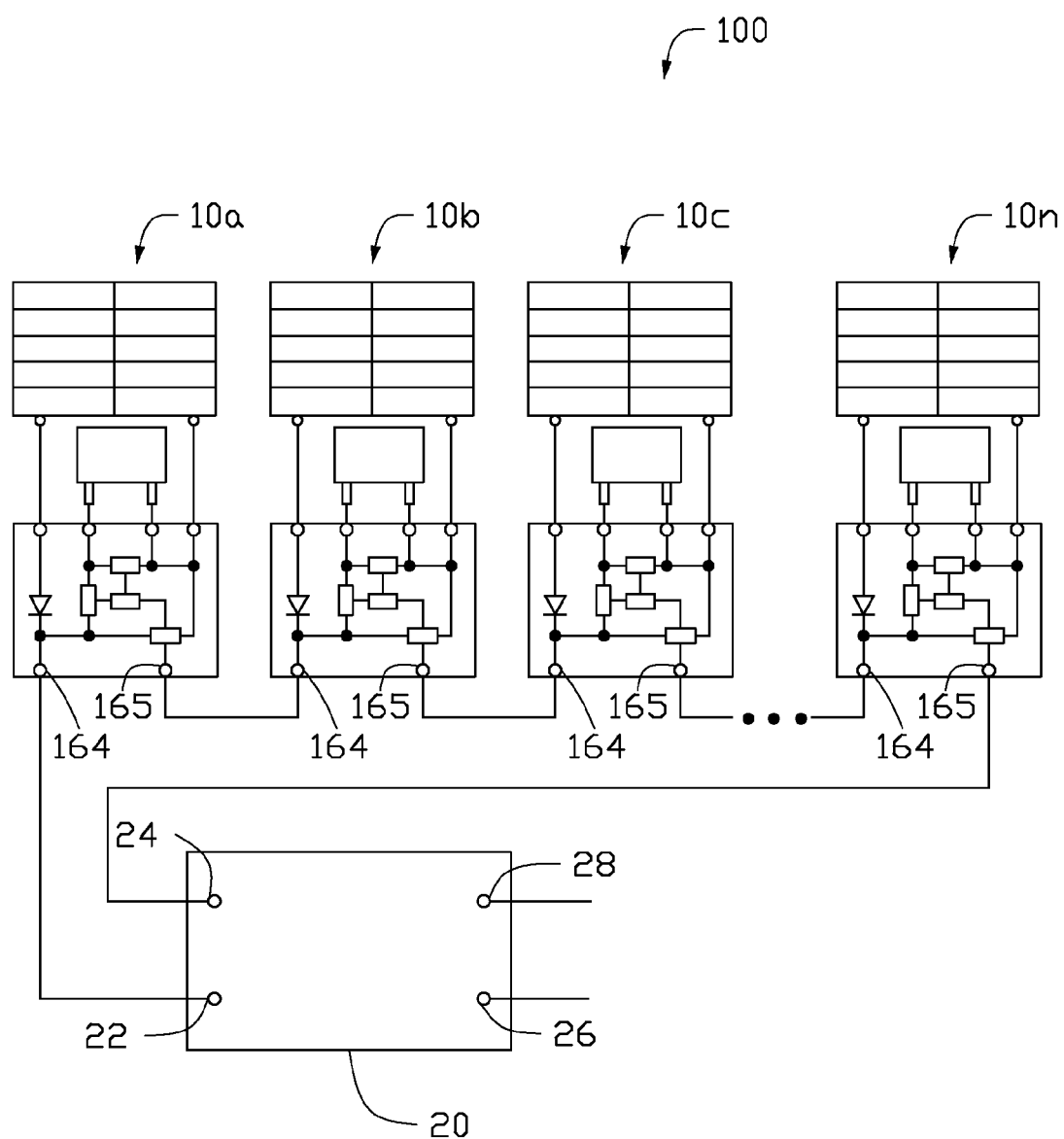
FIG. 2 is a schematic view of one embodiment of a solar power storage system.
Figure 3:
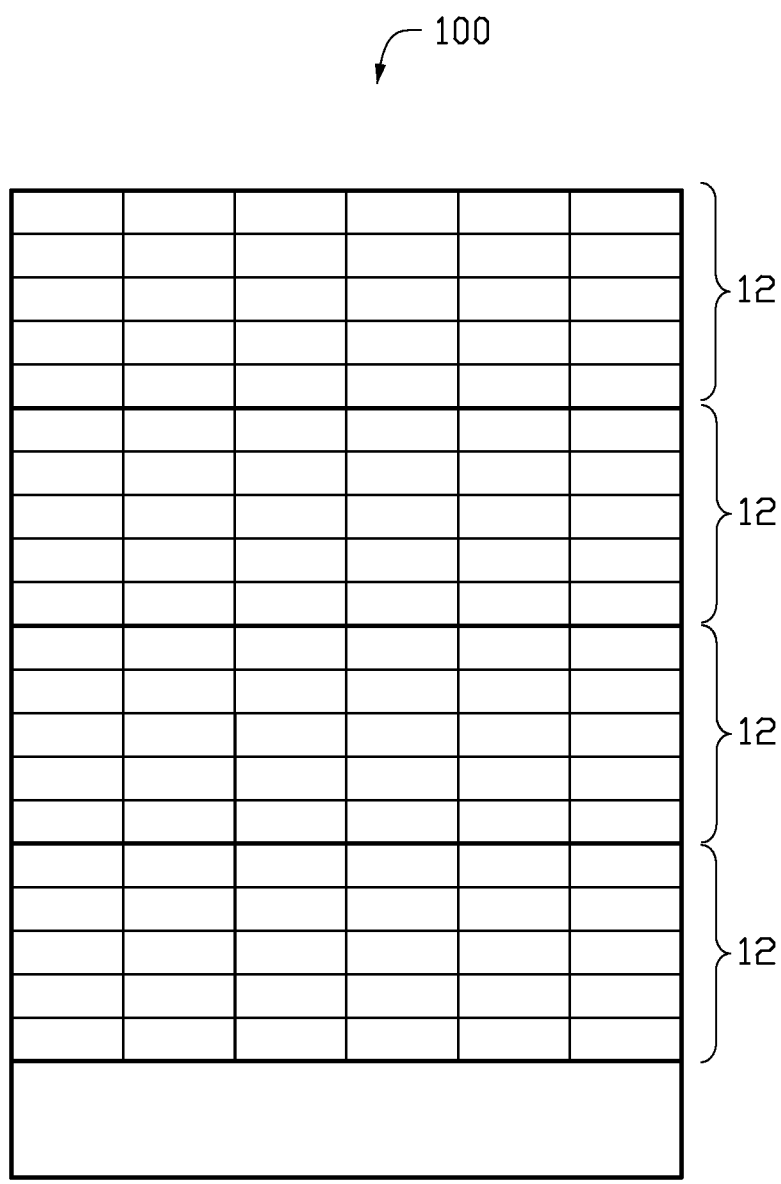
FIG. 3 is a front view of the solar power storage system shown in FIG. 2.
Figure 4:
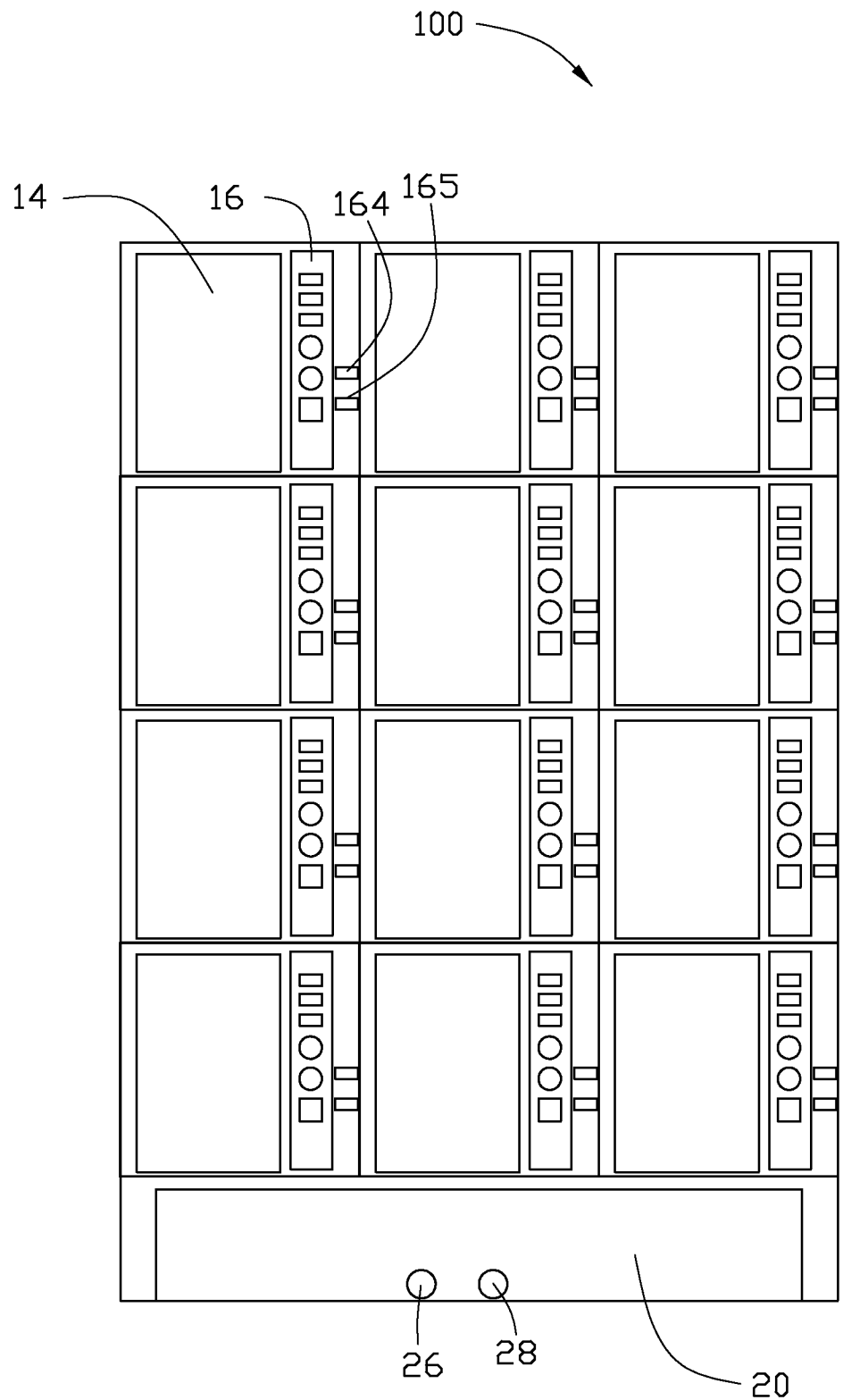
FIG. 4 is a back view of the solar power storage system shown in FIG. 2.

According to one embodiment, a solar power storage system 100 as illustrated in FIGS. 2, 3, and 4 includes an inverter 20 and a number of solar power storage modules 10a, 10b, 10c, . . . , 10n. The solar power storage modules 10a, 10b, 10c, . . . , 10n are electrically connected to each other in series. The inverter 20 is electrically connected to the series-connected solar power storage modules 10a, 10b, 10c, . . . , 10n. Thus, a total output voltage of the solar power storage system 100 is a sum of an output voltage of each of the solar power storage modules 10a, 10b, 10c, . . . , 10n. The inverter 20 could be a DC-to-DC converter or a DC-to-AC inverter.

More specifically, each of the solar power storage modules 10a, 10b, 10c, . . . , 10n includes a first output 164 and a second output 165, a solar cell unit 12, a lithium-ion battery unit 14, and a battery control unit 16. The inverter 20 includes an inverter positive input 22, an inverter negative input 24, an inverter positive output 26, and an inverter negative output 28. The first output 164 of the solar power storage module 10a is electrically connected to the inverter positive input 22 of the inverter 20. The second output 165 of the solar power storage module 10a is electrically connected to the first output 164 of the solar power storage module 10b. The second output 165 of the solar power storage module 10b is electrically connected to the first output 164 of the solar power storage module 10c. Finally, the first output 164 of the solar power storage module 10n is electrically connected to a second output of a previous solar power storage module. The second output 165 of the solar power storage module 10n is electrically connected to the inverter negative input 24 of the inverter 20. The inverter positive output 26 and the inverter negative output 28 is electrically connected to an external load. Thus, the solar power storage modules 10a, 10b, 10c, . . . , 10n supply power to the external load via the inverter 20.

In each of the solar power storage modules 10a, 10b, 10c, . . . , 10n, the battery control unit 16 is electrically connected to the solar cell unit 12 the lithium-ion battery unit 14, and controls the lithium-ion battery unit 14 being charged or discharged by the solar cell unit 12.

More specifically, the lithium-ion battery unit 14 has a cut-off charge voltage and a cut-off discharge voltage. When the operation voltage of the lithium-ion battery unit 14 is equal to or smaller than the cut-off discharge voltage, the battery control unit 16 electrically connects to the solar cell unit 12 and the lithium-ion battery unit 14 in parallel. Thus, the solar cell unit 12 charges the lithium-ion battery unit 14.

Meanwhile, the battery control unit 16 electrically connects to the lithium-ion battery unit 14 and the first output 164, and to the solar cell unit 12 and the first output 164. Furthermore, when the operation voltage of the lithium-ion battery unit 14 is greater than the cut-off discharge voltage, the battery control unit 16 electrically connects to the lithium-ion battery unit 14 and the second output 165, and to the solar cell unit 12 and the second output 165. Thus, the solar cell unit 12 and the lithium-ion battery unit 14 supply power to the external load via the inverter 20 when the solar cell unit 12 charges the lithium-ion battery unit 14.

When the operation voltage of the lithium-ion battery unit 14 is equal to or greater than the cut-off charge voltage, the battery control unit 16 breaks the electrical connection between the lithium-ion battery unit 14 and the solar cell unit 12. The lithium-ion battery unit 14 simultaneously supplies power to the external load via the inverter 20 until the operation voltage of the lithium-ion battery unit 14 is equal to or smaller than the cut-off discharge voltage. The battery control unit 16 then electrically connects to the solar cell unit 12 and the lithium-ion battery unit 14. Thus, the solar cell unit 12 charges the lithium-ion battery unit 14 once more.

More specifically, when the operation voltage of the lithium-ion battery unit 14 is equal to or smaller that the cut-off discharge voltage, the battery control unit 16 shorts the first output 164 and the second output 165. Thus, the solar cell unit 12 and the lithium-ion battery unit 14 cease supplying power to the external load via the inverter 20.

In one embodiment, the solar power storage system 100 includes six solar power storage modules 10. The solar cell unit 12 of each of the solar power storage modules 10 includes ten polycrystalline silicon solar cells electrically connecting to each other in series. An open voltage of the series-connected polycrystalline silicon solar cells is about 5.64 V. A short current of the series-connected polycrystalline silicon solar cells is about 120 milliamperes. The lithium-ion battery unit 14 of each of the solar power storage modules 10 includes six lithium cobaltate batteries electrically connecting to each other in parallel. A cut-off charge voltage of each of the lithium cobaltate batteries is about 4.2 V. A cut-off discharge voltage of each of the lithium cobaltate batteries is about 3.2 V. A discharge capacity of each of the lithium cobaltate batteries is about 3 Ah. The inverter 20 is a DC-to-DC converter. An input voltage of the inverter 20 is in a range from about 12 V to about 36 V. An output voltage of the inverter 20 is about 12 V. A nominal power of the inverter 20 is about 20 Watts.

Figure 5:
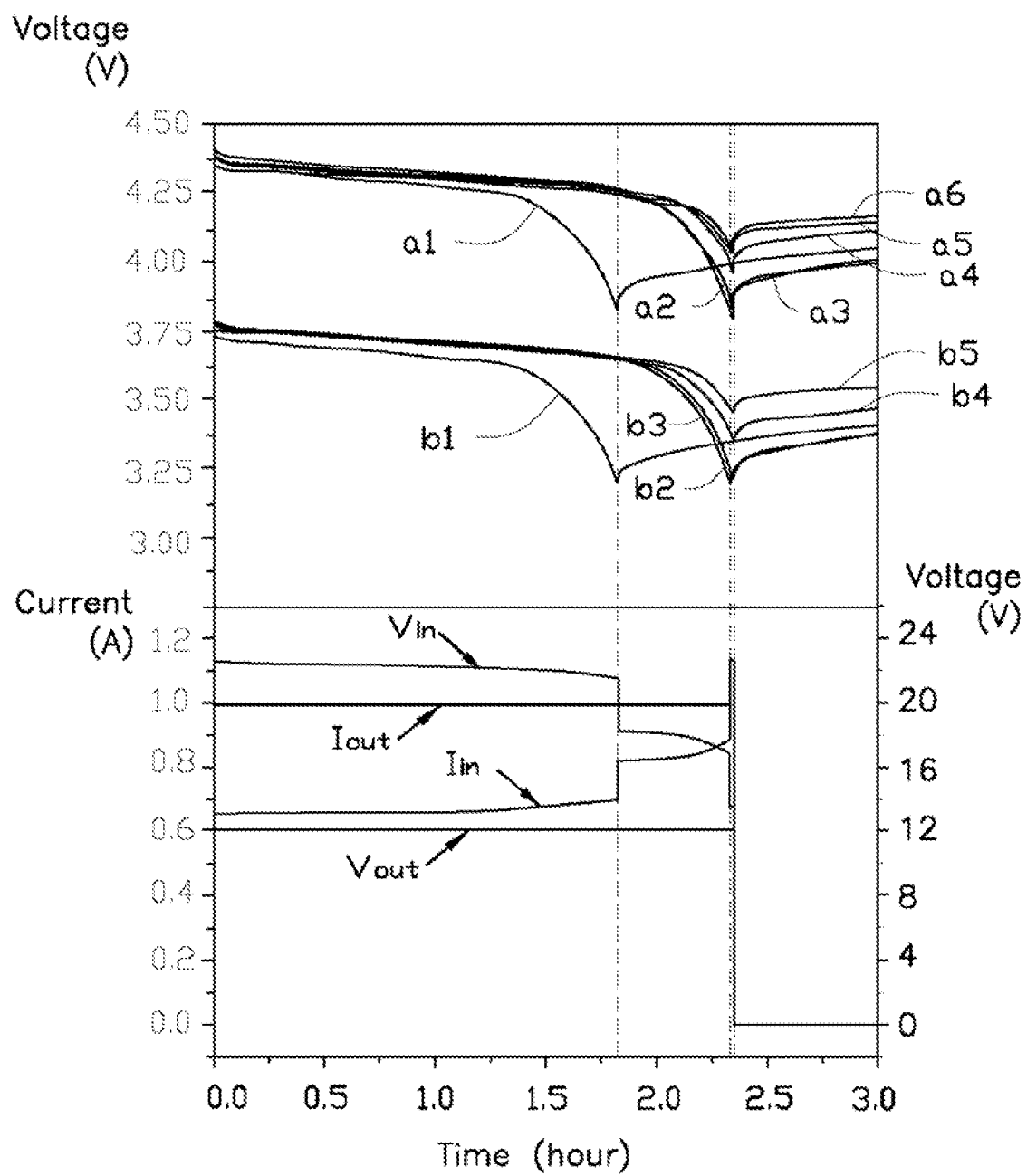
FIG. 5 is a waveform chart of current-voltage characteristic curves when the solar power storage system shown in FIG. 2 supplies power.

As shown in FIG. 5, curves a1, a2, a3, a4, a5, and a6 respectively represent current-voltage characteristic curves of solar cell units 12 in six different solar power storage modules 10 of the solar power storage system 100. Curves b1, b2, b3, b4, b5, and b6 respectively represent current-voltage characteristic curves of lithium-ion battery units 14 in the six different solar power storage modules 10 of the solar power storage system 100. A curve $V_{out}$ presents an output voltage $V_{out}$ of the inverter 20. A curve $V_{in}$ represents an input voltage $V_{in}$ of the inverter 20. A curve $I_{out}$ represents an output current $I_{out}$ of the inverter 20. A curve $I_{in}$ represents an input current $I_{in}$ of the inverter 20.

The solar power storage system 100 supplies power to the external load before about 2.3 hours. The output voltage $V_{out}$ of the inverter 20 is about 12 V. The output current $I_{out}$ of the inverter 20 is about 1 A. The lithium-ion battery unit 14 of each of the solar power storage modules 10 discharges before about 1.8 hours, such that an operation voltage of the lithium-ion battery unit 14 is reduced. The input voltage $V_{in}$ of the inverter 20 is reduced from about 23 V to about 22 V. The input current $I_{in}$ of the inverter 20 is improved from about 0.65 A to about 0.7 A.

Referring to the curve b1, when the lithium-ion battery unit 14 of one of the solar power storage modules 10 discharges to about 1.4 hours, the operation voltage of the lithium-ion battery unit 14 is rapidly reduced. Meanwhile, the input voltage $V_{in}$ of the inverter 20 is reduced. Thus, the input current $I_{in}$ of the inverter 20 is improved to maintain an output power of the inverter 20. When the operation voltage of the lithium-ion battery unit 14 is reduced to about equal the cut-off discharge voltage at about 1.8 hours, the battery control unit 16 shorts the first output 164 and the second output 165. The solar power storage module 10 ceases supplying power. Meanwhile, the input voltage $V_{in}$ of the inverter 20 is reduced from about 22 V to about 18 V. The input current $I_{in}$ of the inverter 20 is improved from about 0.7 A to about 0.85 A. Thus, the output power of the inverter 20 is maintained. Afterward the lithium-ion battery unit 14 is charged by the solar cell unit 12.

Referring to the curve b2, when the lithium-ion battery unit 14 of another solar power storage module 10 discharges for about 2.3 hours, the operation voltage of the lithium-ion battery unit 14 is reduced to about equal the cut-off discharge voltage. The battery control unit 16 shorts the first output 164 and the second output 165. The solar power storage module 10 ceases supplying power. Meanwhile, the input voltage $V_{in}$ of the inverter 20 is further reduced. The input current $I_{in}$ of the inverter 20 is further improved. Thus, the output power of the inverter 20 is maintained.

At about 2.33 hours, the solar power storage system 100 ceases supplying power to the external load because the lithium-ion battery units 14 of all the solar power storage modules 10 are charged.

Figure 6:
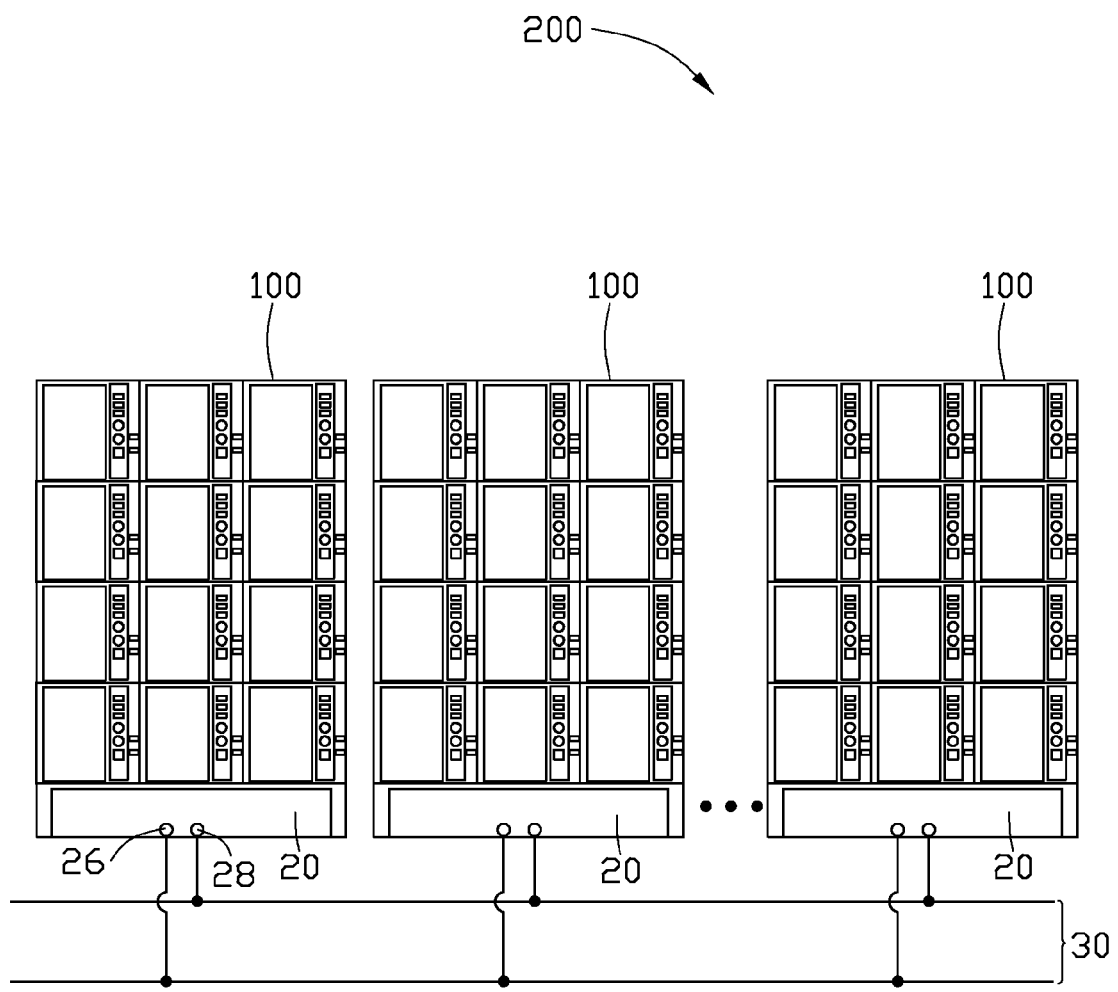
FIG. 6 is a schematic view of one embodiment of a solar power supply system.

According to one embodiment, a solar power supply system 200 as illustrated in FIG. 6 includes a power supply bus 30 and a number of solar power storage systems 100. Inverter positive outputs 26 of the solar power storage systems 100 are electrically connected to each other via the power supply bus 30. Similarly, inverter negative outputs 28 of the solar power storage systems 100 are electrically connected to each other via the power supply bus 30. Thus, the solar power storage systems 100 are electrically connected to each other in parallel. The solar power supply system 200 supplies power to one or more external load via the power supply bus 30.

Accordingly, the present disclosure is capable of providing a solar power supply system which has a number of solar power storage systems. Each of the solar power storage systems has a number of solar power storage modules electrically connecting to each other in series or in parallel. Each of the solar power storage modules has a battery control unit to control a lithium-ion battery unit charged by a solar cell unit or to control a lithium-ion battery unit discharged. An output voltage of the solar power storage system can be maintained when the lithium-ion battery unit of one of the solar power storage modules ceases charging or discharging. Meanwhile, other solar power storage modules would not be influenced because the lithium-ion battery unit of one of the solar power storage modules ceases charging or discharging. Thus, the solar power supply system can have a long service life and high safety performance.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

What is claimed is:

1. A solar power storage module for a solar power storage system, comprising:
    a lithium-ion battery unit;
    a solar cell unit that charges the lithium-ion battery unit; and
    a battery control unit electrically connected to the lithium-ion battery unit and the solar cell unit, the battery control unit controlling the lithium-ion battery unit being charged or discharged, wherein the battery control unit comprises:
        a first output,
        a second output, and
        a discharge protection circuit electrically connected to the first output, the second output, the lithium-ion battery unit, and the solar cell unit;
    wherein the lithium-ion battery unit and the solar cell unit supply power to an external load via the first output and the second output; the lithium-ion battery unit has a cut-off discharge voltage; the discharge protection circuit breaks the electrical connection between the lithium-ion battery unit and the second output, and shorts the first output and the second output when an operation voltage of the lithium-ion battery unit is equal to or smaller than the cut-off discharge voltage such that the lithium-ion battery unit and the solar cell unit ceases supplying power to the external load.

2. The solar power storage module as claimed in claim 1, wherein the battery control unit comprises an overcharge protection circuit electrically connected to the lithium-ion battery unit and the solar cell unit.

3. The solar power storage module as claimed in claim 2, wherein the lithium-ion battery unit has a cut-off charge voltage; the overcharge protection circuit breaks the electrical connection between the lithium-ion battery unit and the solar cell unit when the operation voltage of the lithium-ion battery unit is equal to or greater than the cut-off charge voltage.

4. The solar power storage module as claimed in claim 1, wherein the lithium-ion battery unit has a cut-off charge voltage, the battery control unit further comprises:
    a sensing circuit detecting an operation voltage of the lithium-ion battery unit;
    a control circuit electrically connected to the sensing circuit and compares the operation voltage with the cut-off charge voltage and compares the operation voltage with the cut-off discharge voltage to generate a comparing signal;
    an overcharge protection circuit electrically connecting to the control circuit; and
    the discharge protection circuit electrically connected to the control circuit,
    wherein the overcharge protection circuit controls the lithium-ion battery unit being charged by the comparing signal, and the discharge protection circuit controls the lithium-ion battery unit discharged by the comparing signal.

5. The solar power storage module as claimed in claim 4, wherein the overcharge protection circuit electrically connects to the solar cell unit and the lithium-ion battery unit when the operation voltage is equal to or smaller than the cut-off discharge voltage such that the solar cell unit charges the lithium-ion battery unit.

6. The solar power storage module as claimed in claim 5, wherein the overcharge protection circuit breaks the electrical connection between the lithium-ion battery unit and the solar cell unit when the operation voltage is equal to or greater than the cut-off charge voltage such that the solar cell unit ceases charging the lithium-ion battery unit.

7. The solar power storage module as claimed in claim 5, wherein the battery control unit further comprises a diode electrically connected to the solar cell unit and the lithium-ion battery unit, and the solar cell unit is unable to be charged by the lithium-ion battery unit via the diode.

8. The solar power storage module as claimed in claim 4, wherein the discharge protection circuit electrically connects to the first output, the second output, the lithium-ion battery unit, and the solar cell unit when the operation voltage is greater than the cut-off discharge voltage such that the lithium-ion battery unit and the solar cell unit supply power to an external load via the first output and the second output.

9. The solar power storage module as claimed in claim 1, wherein the lithium-ion battery unit comprises a lithium-ion battery positive output and a lithium-ion battery negative output, the solar cell unit comprising a solar cell positive output and a solar cell negative output; the battery control unit comprises a lithium-ion battery positive input, a lithium-ion battery negative input, a solar cell positive input, and a solar cell negative input; the lithium-ion battery positive input is electrically connected to the lithium-ion battery positive output, the lithium-ion battery negative input is electrically connected to the lithium-ion battery negative output, the solar cell positive input is electrically connected to the solar cell positive output, and the solar cell negative input is electrically connected to the solar cell negative output.

10. The solar power storage module as claimed in claim 1, wherein the solar cell unit comprises a plurality of solar cells connected to each other in series.

11. The solar power storage module as claimed in claim 1, wherein the solar cell unit comprises a plurality of solar cells connected to each other in parallel.

12. The solar power storage module as claimed in claim 1, wherein the solar cell unit comprises at least one solar cell selected from the group consisting of a monocrystalline silicon solar cell, a polycrystalline silicon solar cell, an amorphous silicon solar cell, a multinary compound thin film solar cell, a polymer multilayer modified electrode solar cell, a nanocrystalline solar cell, and an organic solar cell.

13. The solar power storage module as claimed in claim 1, wherein the lithium-ion battery unit comprises at least one lithium-ion battery selected from the group consisting of a lithium iron phosphate battery, a lithium cobaltate battery, a lithium manganate battery, and a lithium cobalt manganate battery.

14. The solar power storage module as claimed in claim 1, wherein the lithium-ion battery unit comprises a plurality of lithium-ion batteries connected to each other in parallel.

* * * * *